(12) United States Patent
Anwar et al.

(10) Patent No.: US 7,589,031 B2
(45) Date of Patent: Sep. 15, 2009

(54) METHOD OF AVOIDING HAZE FORMATION ON SURFACES OF SILICON-CONTAINING PECVD-DEPOSITED THIN FILMS

(75) Inventors: Suhail Anwar, San Jose, CA (US); Chung-Hee Park, Seoul (KR); Beom Soo Park, San Jose, CA (US); Han Byoul Kim, Chon An (KR); Soo Young Choi, Fremont, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 171 days.

(21) Appl. No.: 11/607,702

(22) Filed: Dec. 1, 2006

(65) Prior Publication Data
US 2008/0132080 A1    Jun. 5, 2008

(51) Int. Cl.
*H01L 21/31* (2006.01)
(52) U.S. Cl. ............... 438/788; 438/792; 257/E21.101
(58) Field of Classification Search ................. 438/680, 438/788, 792
See application file for complete search history.

(56) References Cited

U.S. PATENT DOCUMENTS

| 5,242,530 A * | 9/1993 | Batey et al. ............ 117/90 |
| 5,661,093 A * | 8/1997 | Ravi et al. ............. 438/763 |
| 2004/0182697 A1* | 9/2004 | Buda ................ 204/298.08 |
| 2006/0049831 A1 | 3/2006 | Anwar et al. ............. 324/536 |

OTHER PUBLICATIONS

L. Kyung-ha, "A Study on Laser Annealed Polycrystalline Silicon Thin Film Transistors (TFTs) with SiNx Gate Insulator, Chapter 2. Review of ELA Poly-Si TFT-LCDs", Kyung Hee University, Ch. 2 (1998). http://tftlcd.kyunghee.ac.kr/research/poly-Si.
Y. B. Park, et al., "Bulk and Interface Properties of Low-Temperature Silicon Nitride Films Deposited By Remote Plasma Enhanced Chemical Vapor Deposition", *Journal of Materials Science: Materials in Electronics*, vol. 12, pp. 515-522 (2001).
A. Sazonov, et al., "Low Temperature a-Si:H TFT on Plastic Films: Materials and Fabrication Aspects", *Proc. 23rd International Conference on Microelectronics (MIEL 2002)*, vol. 2, pp. 525-528 (May 2002).
D. B. Thomasson et al., "High Mobility Tri-Layer a-Si:H Thin Film Transistors with Ultra-Thin Active Layer", *IEEE Electron Device Letters*, vol. 18, No. 8, pp. 397-399, (Aug. 1997).

* cited by examiner

*Primary Examiner*—Alexander G Ghyka
(74) *Attorney, Agent, or Firm*—Shirley L. Church

(57) ABSTRACT

A method of PECVD deposition of silicon-containing films has been discovered and further developed. The method is particularly useful when the films are deposited on substrates having surface areas which are larger than 25,000 $cm^2$. The method prevents the deposition of partially reacted silicon-containing species which form a powdery material or haze (contaminant compound) on the substrate surface. The contaminant compounds are avoided by assuring that the power applied to form a plasma in the PECVD process is maintained, at least at a minimal level, until reactive silicon-containing precursor gases present above the surface of the substrate have been reacted or evacuated from the plasma processing area.

5 Claims, 10 Drawing Sheets ic*US 7,589,031 B2*

METHOD OF AVOIDING HAZE FORMATION ON SURFACES OF SILICON-CONTAINING PECVD-DEPOSITED THIN FILMS

BACKGROUND OF THE INVENTION

1. Field of the Invention

The invention generally relates to a method of controlling process variables during PECVD deposition of a silicon-containing thin film. One important functional result of the variable control is avoidance of the uncontrolled deposition silicon-containing reactant species in the form of a film which creates a haze on a substrate.

2. Brief Description of the Background Art

Current interest in thin film transistor (TFT) arrays is particularly high because these devices are used in liquid crystal active matrix displays (LCDs) of the kind often employed for computer and television flat panels. The liquid crystal active matrix displays may also contain light-emitting diodes (LEDs) for back lighting. As an alternative to LCD displays, organic light-emitting diodes (OLEDs) have also been used for active matrix displays, and these organic light-emitting diodes require TFTs for addressing the activity of the displays.

The thin films deposited to form the TFT arrays are typically deposited upon a substrate using a plasma enhanced chemical vapor deposition (PECVD) process. PECVD is generally accomplished by introducing a precursor gas or gas mixture into a vacuum chamber that contains the substrate. The precursor gas or gas mixture is typically directed downwardly through a distribution plate situated adjacent to a substrate on which a film is to be deposited. The precursor gas or gas mixture in the chamber is energized (e.g., excited) into a plasma by applying energy to the gas mixture. One commonly used method of energy application (by way of example and not by way of limitation) is the introduction of radio frequency (RF) power into the chamber from one or more RF sources coupled to the chamber. The excited gas or gas mixture reacts to form a layer of material on a surface of the substrate that is positioned on a temperature controlled substrate support. Volatile by-products produced during the reaction are pumped from the chamber through an exhaust system.

The materials which form TFT arrays are typically deposited on a flat substrate using plasma enhanced chemical vapor deposition (PECVD). The substrate may be a semiconductor substrate, but more often is a transparent substrate, such as a glass, quartz, sapphire, or a clear plastic film. TFT arrays typically employ silicon-containing films, and, in particular, silicon nitride-containing films are often used for dielectric layers. A first silicon nitride-comprising film is referred to as the gate dielectric because it overlies the conductive gate electrode. A second silicon nitride-comprising film is referred to as the passivation dielectric and overlies the upper surface of a second conductive electrode, to electrically isolate the second conductive electrode from the ambient surrounding the upper surface of the TFT device.

There are a number of TFT structures which may employ silicon nitride gate insulators, and several of these are presented in a disclosure entitled "A Study on Laser Annealed Polycrystalline Silicon Thin Film Transistors (TFTs) with SiNx Gate Insulator", by Dr. Lee Kyung-ha (Kyung Hee University, 1998). This disclosure is available at http://tftcd-.khu.ac.kr/research/polySi. Dr. Lee Kyung-ha's disclosure pertains mainly to the use of laser annealed poly-Si TFTs, which is not the subject matter of the present invention, but the TFT structures are of interest as background material. The structures of interest are presented in Chapter 2 of the disclosure.

D. B. Thomasson et al., in an article entitled: "High Mobility Tri-Layer a-Si:H Thin Film Transistors with Ultra-Thin Active Layer" (1977 Society for Information Display International Symposium Digest of Technical Papers, volume 28, pages 176-179), describe active matrix liquid crystal displays where the TFT has an active layer thickness of about 13 nm. The TFT structure is a glass substrate with a molybdenum bottom electrode, a silicon nitride gate dielectric layer, an a-Si:H layer overlying the silicon nitride gate dielectric layer, n+ μc-Si:H doped source and drain regions, separated by a silicon nitride dielectric mesa, and with an aluminum contact layer overlying each source and drain region. This is referred to as a Tri-layer a-Si:H TFT structure. The authors claim that such hydrogenated amorphous silicon thin-film transistors with active layer thickness of 13 nm perform better for display applications than devices with thicker (50 nm) active layers. The linear ($V_{DS}$=0.1V) and saturation region mobility of a 5 μm channel length device is said to increase from 0.4 $cm^2$/V·sec and 0.7 $cm^2$/V·sec, for a 50 nm a-Si:H device, to 0.7 $cm^2$/V·sec and 1.2 $cm^2$/V·sec, for a 13 nm a-Si:H layer device fabricated with otherwise identical geometry and processing. The gate dielectric silicon nitride was deposited from a reactant gas mixture of $SiH_4$, $NH_3$, and Ar at 100 mW/$cm^2$, −150 V, 0.5 Torr, and 300° C. The passivation silicon nitride dielectric layer was deposited at the same conditions as the gate dielectric, with the exception of the substrate temperature, which was 250° C.

Young-Bae Park et al., in an article entitled: "Bulk and interface properties of low-temperature silicon nitride films deposited by remote plasma enhanced chemical vapor deposition" (Journal of Materials Science: Materials in Electronics 23 (2001), pp. 515-522), describe problems which occur when a gate dielectric, rather than being $SiN_x$, is a hydrogenated silicon nitride film (a-$SiN_x$:H). PECVD a-$SiN_x$:H thin films are said to be widely used as a gate dielectric for a-Si:H TFT applications, due to the good interfacial property between an a-Si:H layer and an a-$SiN_x$:H layer. However, the a-Si:H TFTs with $SiN_x$:H gate dielectric are said to have instability problems, such as the threshold voltage shift and the inverse subthreshold slope under a DC gate voltage bias. These instability problems are said to be caused by the high trap density in the $SiN_x$:H film and the defects created at the a-Si:H/$SiN_x$:H interface. Charge trapping in the $SiN_x$:H is said to be from the electron injection under an applied field and due to the localized states of the Si dangling bonds, Si—H and N—H bonds in the forbidden gap. The authors claim that PECVD $SiN_x$:H dielectric films are not useful as a gate insulator because they contain large amounts of bonded hydrogen (20%-40%) in the form of N—H and Si—H bonds.

The authors propose that a remote plasma enhanced chemical vapor deposition of the gate dielectric layer be carried out. The $NH_3$ precursor is excited in a remote plasma zone (at the top of the chamber) to produce NH* or $NH_2$*+H*, after which the activated species* from the plasma zone react with $SiH_4$ introduced downstream through a gas dispersal ring to form the $SiN_x$:H electrical insulator with a reduction in the amounts of bonded hydrogen in the form of Si—H bonds, which are said to easily lose hydrogen to form a dangling bond of the kind known to reduce performance of the TFT device over time.

A presentation entitled: "Low Temperature a-Si:H TFT on Plastic Films: Materials and Fabrication Aspects", by Andrei Sazonov et al. (Proc. 23rd International Conference on Microelectronics (MIEL 2002), Vol. 2, NIS, Yugoslavia, 12-15 May 2002), related to fabrication technology for a-SiH thin film transistors at 120° C. for active matrix OLED displays on flexible plastic substrates. The TFTs produced were said to demonstrate performance very close to those fabricated at 260° C. The authors claim that, with the proper pixel integration, amorphous hydrogenated silicon (a-Si:H) TFTs are capable of supplying sufficiently high current to achieve required display brightness and thus can be a cost-effective solution for active matrix OLED displays.

The silicon nitride films used to produce the fabricated TFT samples were amorphous silicon nitride deposited at 120° C. by PECVD from $SiH_4$ and $NH_3$ gaseous precursors. The film is said to have a lower mass density and higher hydrogen concentration in comparison with films fabricated at 260° C. to 320° C. In the study, a series of a-$SiN_x$:H films with [N]/[Si] ratio ranging from 1.4 to 1.7 were deposited (at 120° C.). The hydrogen content in the films was in the range of 25-40 atomic percent. Generally, the films with higher [N]/[Si] are said to have higher mass density and higher compressive stress. The resistivity of a-$SiN_x$:H films estimated at the field of 1 MV/cm was said to be in the range of $10^{14}$-$10^{16}$ Ohm·cm, and the films with higher [N]/[Si] were said to have a higher breakdown field and dielectric constant than their lower N-content counterparts. A table of data supporting these conclusions was presented as part of the presentation.

Compared to their higher temperature counterparts, the lower temperature a-$SiN_x$ films are characterized by higher hydrogen content. The nitrogen-rich films with a hydrogen concentration of about 40% or more exhibit hydrogen bonded predominantly to nitrogen atoms, with a high [N]/[Si] ratio achieved solely due to the high concentration of N—H bonds. The TFTs produced an a plastic film substrate at lower temperatures require a higher threshold voltage (4-5 V) than the TFTs produced on glass at the higher temperatures. As a result, the ON current observed for TFTs produced at the lower temperatures is lower. Although the performance properties of these TFTs complies with the requirements for OLED applications, it is apparent that it would be beneficial to lower the threshold voltage of the TFTs produced at the 120° C. temperature.

As indicated above, the performance capabilities of the TFT are a direct result of the structural characteristics of the films formed during fabrication of the TFTs. The structural characteristics of the films depend directly upon the process conditions and relative amounts of precursors which are used during formation of the films which make up the TFTs. As the size of flat panel displays increase, it becomes increasingly difficult to control the uniformity of the individual films produced across the increased surface area. With respect to PECVD deposited silicon-nitride comprising films, which are used either as the gate dielectric layer or as the passivation dielectric layer, control of uniformity of the film across the substrate becomes increasingly important when the PECVD is carried out in a process chamber having parallel-plate capacitively-coupled electrodes over about two meters by two meters.

The disclosure above is related to the deposition of silicon nitride films to form TFT structures. This is to emphasize how a change in film deposition variables has a major effect on the electrical characteristics and performance of the device which includes the deposited film. However, the present invention is not intended to be limited to instances where a silicon nitride film is deposited, but is also applicable in instances where polycrystalline silicon (polysilicon), microcrystalline silicon (μc-Si), amorphous silicon (α-silicon), and silicon oxide films are deposited, by way of example and not by way of limitation.

The flat substrates upon which large TFT display devices are created frequently comprises a material that is essentially optically transparent in the visible spectrum, as discussed above. The substrate may be of varying shapes or dimensions. Typically, for TFT applications, the substrate is a glass substrate with a surface area greater than about 40,000 $cm^2$.

Another device which employs the use of silicon-containing films and which is also typically created on a large substrate surface is a solar cell. Solar cells may be fabricated using techniques which are similar to those described above, where silicon-containing films are deposited using PECVD deposition techniques. The substrates for solar cells typically exhibit a surface area in the range of about 40,000 $cm^2$ to about 60,000 $cm^2$.

During recent process development by the current inventors with respect to large TFT display screens, there were instances where a haze was observed on the transparent substrate during processing; particularly during processing which involved the deposition of silicon-containing films. It was subsequently determined that the TFT device performance was affected by the processing conditions which produced the haze. With respect to OLED devices, a silicon-containing passivation layer which exhibits a haze produces a fuzzy, less desirable image.

Prior to the present invention, there was a need to determine the cause of the haze, which was an indication of unacceptable process conditions during the PECVD deposition of silicon-containing films on large substrate surfaces (where the substrate surface area was larger than about 25,000 $cm^2$).

SUMMARY OF THE INVENTION

An improved method of PECVD deposition of silicon-containing films has been discovered and further developed. The silicon-containing films are useful in the manufacture of TFT structures, solar cells, and OLED structures and FED structures, by way of example and not by way of limitation. The method is particularly useful when the films are deposited on substrates having surface areas which exceed about 1500 mm×1600 mm. The method prevents the deposition of partially reacted silicon-containing compounds which contaminate a silicon-containing film which is being deposited. In the past, this contamination has been observed as a haze on the surface of a transparent substrate during the processing of large TFT display device screens, for example.

After considerable experimentation, the inventors determined that the haze formation could be avoided by assuring that the power applied to form a plasma in the PECVD process was maintained, at least at a minimal level, until reactive silicon-containing compounds present above the surface of the substrate have been evacuated from the plasma processing area or have been consumed.

In a process chamber of the type described in the detailed description below, the power applied to form a plasma is RF power, which is applied in the parallel plate PECVD chamber in the manner described. To prevent the deposition of partially reacted silicon compound (or compounds) which contaminate a PECVD-deposited silicon-containing film, the RF power is left on after discontinuance of the gas flow of the silicon-containing compound precursor gas, for a time period which provides for removal of any significant amount of silicon-containing compound precursor gases from the plasma processing area of the PECVD chamber. The amount of silicon-containing compound precursor gases present in the plasma processing area at the time the RF power is shut down should be nearly zero percent, depending on the economics (the time lost achieving removal of silicon-containing gases is balanced against product lost and reduced performance/quality of the product produced).

The amount of time required to remove the silicon-containing compound precursor from the plasma source gases present in the plasma processing area depends on the residence time of the silicon-containing compound gas in the plasma processing area after the shut off of the flow of the silicon containing compound precursor gas. The residence time depends on the process chamber design, the volume of the plasma processing area in the processing chamber, and the gas flow rate of the non-silicon-containing plasma source gases which are flowing through the plasma processing area of the chamber after shut down of the gas flow of the silicon-containing plasma source gases. One of skill in the art can calculate an estimated amount of time for removal of the silicon-containing compound precursor gas, and with minimal experimentation can optimize the time for a given process chamber design.

For large parallel plate substrate processing chambers of the kind described herein, where the substrate surface area exceeds about 40,000 $cm^2$ for example; or where the substrate dimensions exceed about 1850 mm×2200 mm, for example, the time required to permit the complete reaction of or evacuation of unreacted silicon-containing compound precursors is typically in the range of about 1 second to about 3 seconds.

Depending on the overall composition of the plasma source gas components other than the silicon-containing compound precursor gas, it may be desirable to replace or to supplement the non-silicon-containing portion of the plasma source gas during the time the residual silicon-containing compound gas is being removed. A plasma source gas used to replace or to supplement the non-silicon-containing portion of the plasma source gas should be one which will not affect the composition of the deposited silicon-containing film and which will not detrimentally affect the surface texture (finish) present on the surface of the deposited silicon-containing film. Whether the affect of the plasma on the surface texture of the deposited film is detrimental will depend on the device which is being fabricated. Typically the gases used to form the plasma in contact with the deposited film surface during removal of the silicon-containing precursor source gas is one which will not react with the film surface, frequently noble gases are used, and in some instances nitrogen or hydrogen may be used. In determining whether surface texture of the deposited film will be affected, argon plasma is known to have a greater effect on film surface roughness than helium plasma, for example. One skilled in the art can examine any change in the surface texture and adjust the composition of the non-silicon-containing plasma source gas appropriately.

There are instances where arcing is observed in the plasma processing chamber, and the typical response in the industry has been to shut off the plasma source gas power supply until the arcing is under control. Recently, due to the increase in substrate size being processed to produce display apparatus, the haze which is indicative of detrimental silicon-containing film deposition conditions, has been observed when the power source for the plasma has been shut down. It has been discovered that it is advisable to avoid an immediate shut off the plasma source power. Instead, it is better to reduce the amount of power to a minimal amount necessary to support the plasma, until the flow of silicon-containing precursor plasma source gases can be shut off and the residual unreacted silicon-containing compound can be removed from the processing volume of the process chamber. The minimal amount of power necessary to maintain the plasma is easily determined by one of skill in the art, based on the overall process conditions in the plasma processing chamber and the composition of and flow rate of the non-silicon-containing plasma source gas present within the plasma processing chamber. Again, it may be desirable to replace or to supplement the non-silicon-containing portion of the plasma source gas during the time the residual silicon-containing compound gas is being removed.

With reference to a PECVD chamber capable of processing substrates which exhibit a surface area of 25,000 $cm^2$ or more, a minimal plasma source power level of about 2% to about 15% of normal operating power level is maintained, typically for a time period of about 3 seconds or more after discontinuance of the flow of a reactive silicon precursor gas used to form the silicon-containing film. Again, one skilled in the art can estimate the possible power reduction based on normal operating conditions, and can optimize the power level to be used after detection of arcing in the system. The detection equipment used to detect arcing can be used to determine whether the arcing in brought under control at the reduced power level.

The plasma is maintained after the discontinuance of flow of the silicon-containing precursor gas using the non-silicon-containing gases to make up the plasma source gas.

BRIEF DESCRIPTION OF THE DRAWINGS

The teachings of the present invention can be readily understood by considering the following detailed description in conjunction with the accompanying drawings.

FIG. 5A illustrates the relationship between a gas distribution plate 516 and gases flowing therefrom with the surface of a substrate 540 which is being processed.

To facilitate understanding, identical reference numerals have been used, where possible, to designate identical elements that are common to the figures.

DETAILED DESCRIPTION OF EXEMPLARY EMBODIMENTS

As a preface to the detailed description presented below, it should be noted that, as used in this specification and the appended claims, the singular forms "a", "an", and "the" include plural referents, unless the context clearly dictates otherwise.

Use of the term "about" herein is an indication that the value presented is accurate to within ±10%.

Use of the term "essentially zero" in a claim herein is intended to mean that any amount of a component named which is present over zero amount does not have a material effect on a product produced by the method of the invention.

An improved method of PECVD deposition of silicon-containing films, which films are useful in the manufacture of TFT structures, solar cells, OLED structures, and FED structures, for example and not by way of limitation, has been discovered and further developed. The method is particularly useful when the films are deposited on substrates having surface areas which exceed about 1500 mm×1600 mm. The method prevents the deposition of partially reacted silicon compounds which contaminate a silicon-containing film which is being deposited. This contamination has been observed as a haze on the surface of a transparent substrate during the processing of large TFT display device screens, for example and not by way of limitation.

Prior to the substrate surface area reaching at least 25,000 $cm^2$, where typical substrate dimensions might be 1500 mm×1650 mm or larger, for example, process variable adjustments, to accommodate a plasma arcing event, or to accommodate a change in composition from one film layer to a different film layer, in a PECVD film deposition process did not appear to have a significant effect on the performance of the fabricated device.

However, upon fabrication of the larger dimensioned substrates, a haze was observed on the surface of various films during fabrication of the device. Further analysis indicated that the haze was accompanied by a significant change in device performance. The change in device performance was traced to a difference in three dimensional physical structure and chemical composition of the film on which the haze had appeared. The haze was observed in at least two instances. For example, a haze was observed when a silicon-containing film deposition was completed and the gas flow of the silicon-containing precursor used in film deposition was discontinued, followed by start up of gas flow of a different precursor, for deposition of a different film. A haze of the depositing film surface was also observed when the power to the plasma generation source had to be shut down due to arcing.

Figure 1:
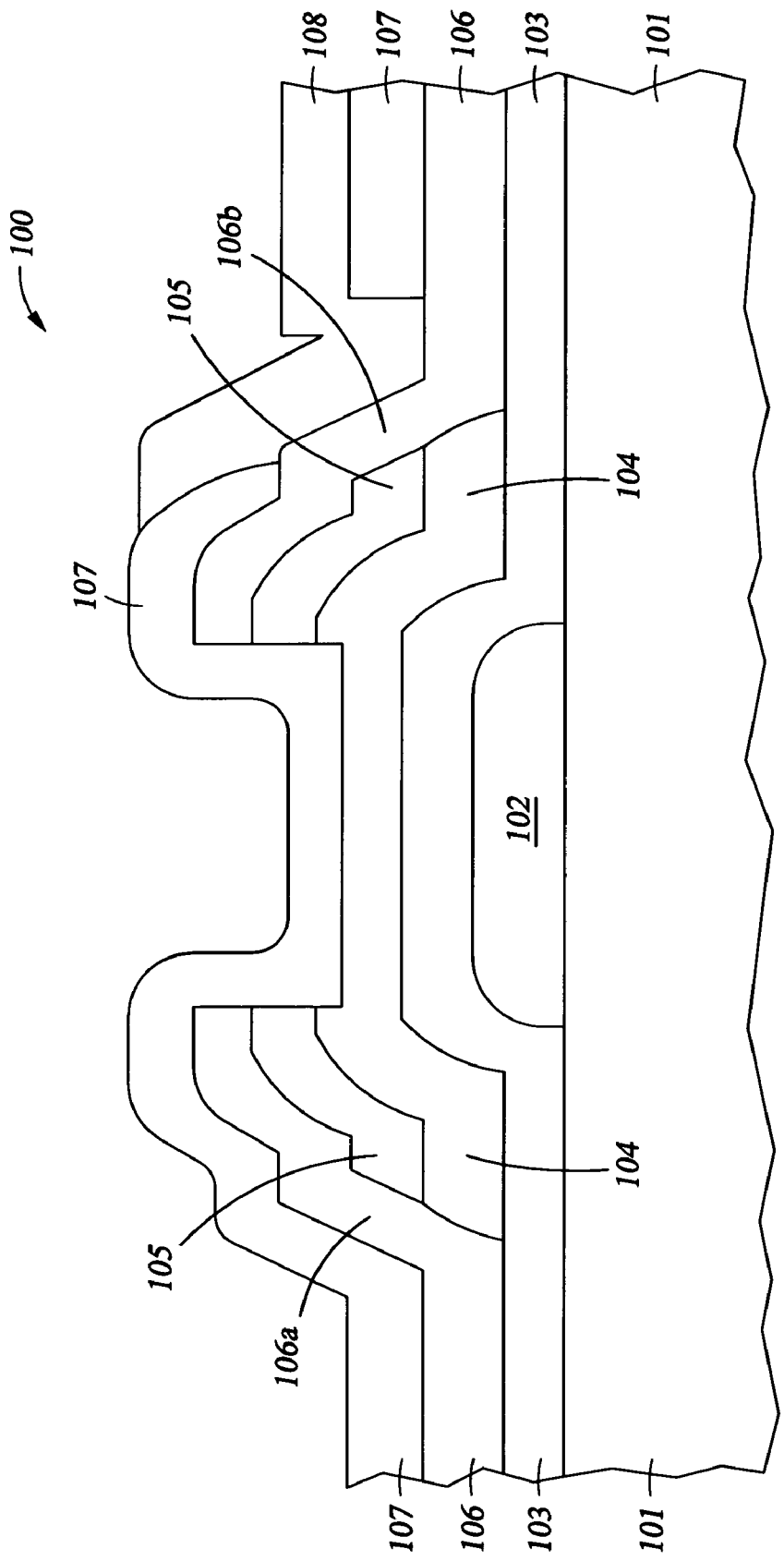
FIG. 1 shows a schematic cross-sectional view of one embodiment of a TFT device 100 which may be fabricated in a manner which avoids haze formation, by using the method of the present invention.

FIG. 1 illustrates a schematic cross-sectional view of a thin film transistor structure of the kind which may benefit from use of the method of the present invention. This kind of thin film transistor is frequently referred to as an inverse staggered α-Si TFT with a $SiN_x$ layer as a gate insulator or as a back channel etch (BCE) inverted staggered (bottom gate) TFT structure. This structure is one of the more preferred TFT structures because the gate dielectric ($SiN_x$) and the intrinsic as well as n+ (or p+) doped amorphous silicon films can be deposited in a single PECVD pump-down run. The BCE TFT shown in FIG. 1 involves only 4 or 5 patterning masks. This TFT structure contains a number of silicon-comprising layers which can benefit from the present method of invention which provides improved control of the three-dimensional physical structural and chemical composition of the silicon-comprising layers, enhancing the performance of the layers.

The TFT structure substrate 101 typically comprises a material that is essentially optically transparent in the visible spectrum, such as glass, quartz, sapphire, or a clear plastic. The substrate may be of varying shapes or dimensions. Typically, for TFT applications, the substrate is a glass substrate with a surface area greater than about 500 mm$^2$. A gate electrode layer 102 is formed on the substrate 101. The gate electrode layer 102 may comprise a metal layer such as, for example, aluminum (Al), tungsten (W), chromium (Cr), tantalum (Ta), molybdenum (Mo), molybdenum tungsten (MoW), titanium (Ti), or combinations thereof, among others. The gate electrode layer 102 may be formed using conventional deposition, lithography and etching techniques. Between the substrate 101 and the gate electrode layer 102, there may be an optional (not shown) insulating layer, for example, such a silicon oxide, or silicon nitride, which may also be formed using a PECVD system.

A gate dielectric layer 103 is formed on the gate electrode layer 102. The gate dielectric layer may be silicon oxide, silicon oxynitride, or silicon nitride, deposited using such a PECVD system. The gate dielectric layer 103 may be formed to a thickness in the range of about 100 Å to about 6,000 Å.

A bulk semiconductor layer 104 is formed on the gate dielectric layer 103. The bulk semiconductor layer 104 may comprise polycrystalline silicon (polysilicon), microcrystalline silicon (μc-Si), or amorphous silicon (α-silicon), which films can also be deposited using a PECVD system, or other conventional methods known in the art. Bulk semiconductor layer 104 may be deposited to a thickness in the range of about 100 Å to about 3,000 Å. A doped semiconductor layer 105 is formed on top of the semiconductor layer 104. The doped semiconductor layer 105 may comprise n-type (n+) or p-type (p+) doped polycyrstalline, microcrystalline, or amorphous silicon. Doped semiconductor layer 105 may be deposited to a thickness within a range of about 100 Å to about 3,000 Å. An example of the doped semiconductor layer 105 is n+ doped α-silicon film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surfaces of gate dielectric layer 103, semiconductor layer 104, and doped semiconductor layer 105. The conductive layer 106 may comprise a metal such as, for example, aluminum, tungsten, molybdenum, chromium, tantalum, and combinations thereof, among others. The conductive layer 106 may be formed using conventional deposition techniques. Both the conductive layer 106 and doped semiconductor layer 105 may be lithographically patterned to define source and drain contacts of the TFT, 106a and 106b, respectively in FIG. 1. After formation of the source and drain contacts 106a and 106b, a passivation dielectric layer 107 is typically applied. The passivation dielectric layer may be, for example, a silicon oxide or a silicon nitride. The passivation layer 107 may be formed using, for example, PECVD or other conventional methods known in the art. The passivation layer 107 may be deposited to a thickness in the range of about 1,000 Å to about 5,000 Å. The passivation layer 107 is then lithographically patterned and etched using conventional techniques, to open contact holes in the passivation layer.

A transparent electrically conductive layer 108 is then deposited and patterned to make contacts with the conductive layer 106. The transparent conductor layer 108 comprises a material that is essentially optically transparent in the visible spectrum. Transparent conductor 108 may comprise, for example, indium tin oxide (ITO), zinc oxide, or tin oxide, among others. Patterning of the transparent electrically conductive layer 108 is accomplished by conventional lithographic and etching methods.

Figure 2:
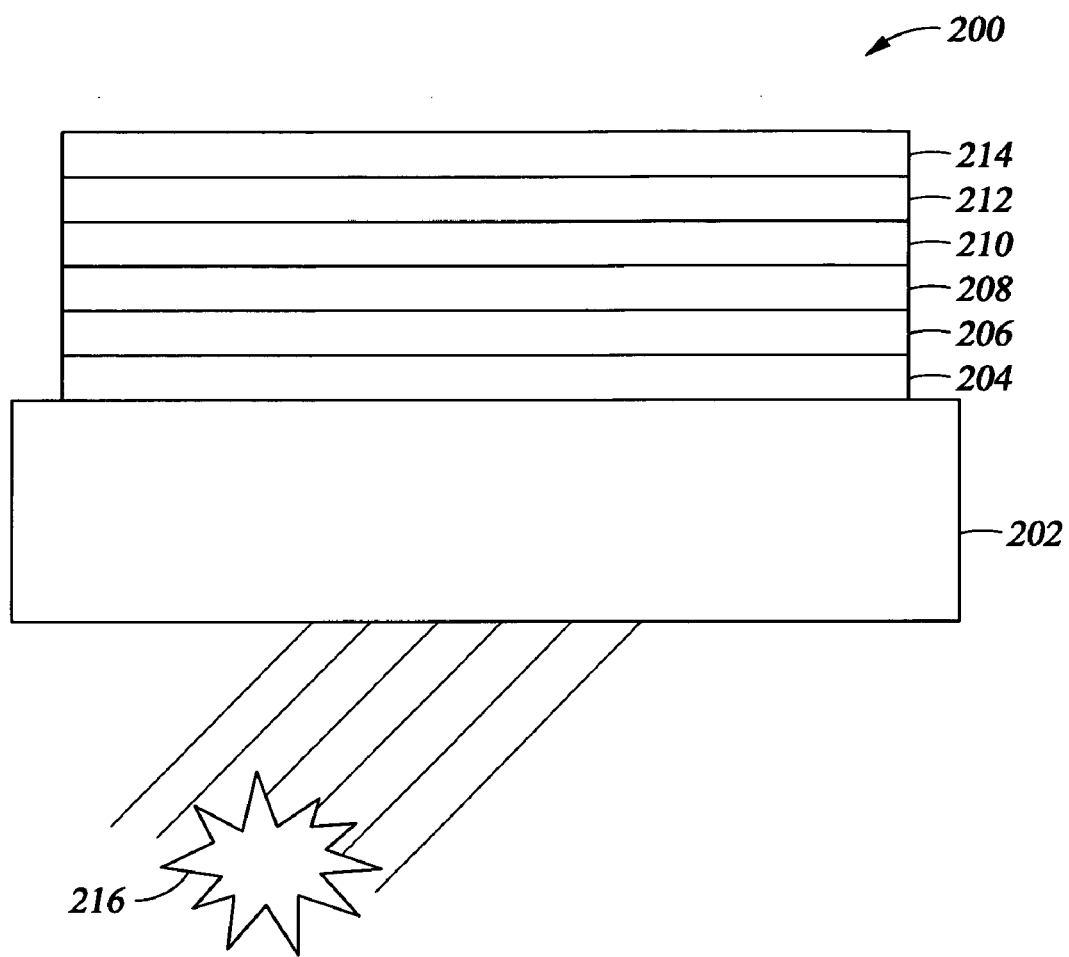
FIG. 2 shows schematic cross-sectional view of one embodiment of a single PIN cell 200 of the kind used in solar arrays, which may also be fabricated in a manner which avoids haze formation, by using the method of the present invention. There are a number of different embodiments for PIN cells which may be used in addition to the embodiment shown.

FIG. 2 illustrates a schematic cross-sectional view of a single junction PIN cell 200 of the kind which are used in solar cell arrays. The single junction PIN cell 200 includes, beginning at the surface which transmits light, which light is shown as element 216, a light transmitting, typically transparent layer 202 which may be glass, quartz, sapphire, or a clear plastic film, by way of example, but not by way of limitation. Overlying the light transmitting layer 202, is a transparent conductor layer, TOC, 204 which may be ZnO, $SnO_2$, $In_2O_3SnO_2$ (ITO), or other transparent conductive material, which is typically deposited using a physical vapor deposition (PVD) process. Overlying the TOC layer 204 is a p layer 206, which may be boron doped α-silicon or boron doped μ-crystalline silicon, for example. The boron doped α-silicon or μ-crystalline silicon may be deposited using PECVD techniques. Overlying the p layer 206 is an i layer 208, which may be α-silicon or μ-crystalline silicon, for example, also deposited using a PECVD process. Overlying the i layer 208 is an n layer 210, which may be phosphorus doped α-silicon or phosphorous doped μ-crystalline silicon, for example. The phosphorus doped α-silicon or μ-crystalline silicon may be deposited using a PECVD technique. Overlying n layer 210 is a second TOC layer 212; and, overlying the second TOC layer 212 is a layer of conductive material 214 which is typically silver or aluminum, for example, as these materials provide good reflectivity. The conductive layer 214 may be deposited by either PVD or by PECVD, with PVD being used more often due to the higher purity and lower resistivity of the deposited layer.

Again, when the method of the present invention is applied to thin film layers of a PIN cell which are formed using PECVD, there is better control over both the three-dimensional physical structure and the chemical composition of the deposited film layer, leading to an improved performance in the PIN cell.

A number of different structures may be used for PIN cells. For example, the PIN cell may be a p/intrinsic amorphous silicon/n cell., or the PIN cell may be a p/intrinsic microcrystalline silicon/n cell. Use of these two types of PIN cells in tandem provides advantages because the peak absorption wavelength of the two silicon-comprising materials are different, and therefore use of a combination of these two kinds of PIN cells captures more energy from the light spectrum of the sun.

Solar Cells may be fabricated using techniques which are similar to those used to fabricate TFT devices, where silicon-containing films are deposited using PECVD deposition techniques. The substrates for solar cells typically exhibit a surface area which exceeds about 40,000 cm$^2$. The problem described above with reference to a change in light transmission properties and in electrical properties of a silicon-containing film is of great concern in the fabrication of solar cells as well as in the fabrication of display modules which make use of TFT technology, such as liquid crystal displays.

Figure 3:
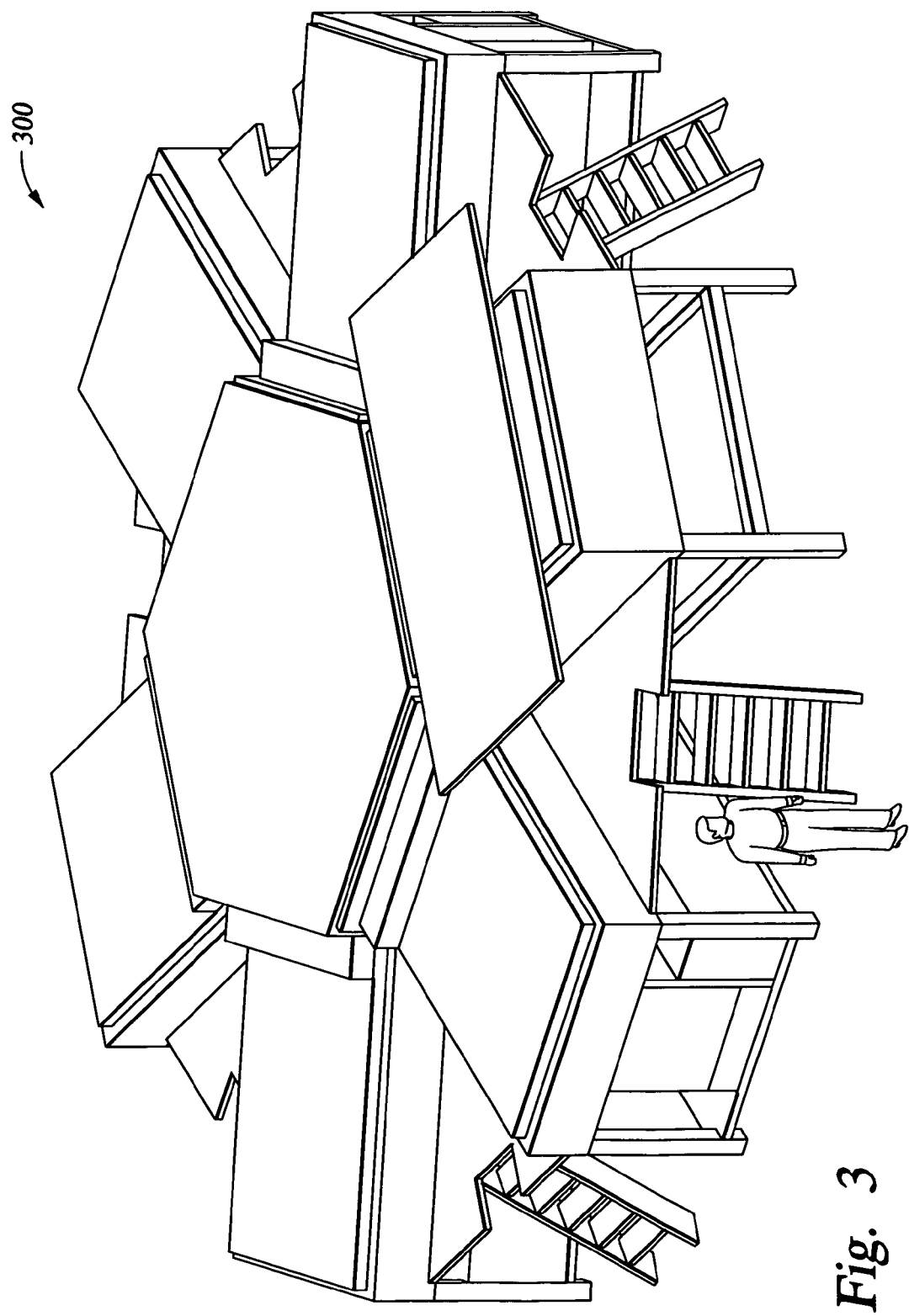
FIG. 3 shows perspective view of a PECVD processing system 300 of the kind which can be used to deposit thin films on large surface area substrates, in accordance with the method of the present invention. This figure is provided to better illustrate the size of the apparatus which is required to process substrates of the dimension described herein.

FIG. 3 shows perspective view of a PECVD processing system 300 of the kind which can be used to deposit thin films on large surface area substrates, in accordance with the method of the present invention. This figure is provided to better illustrate the size of the apparatus which is required to process substrates of the dimension described herein.

Figure 4:
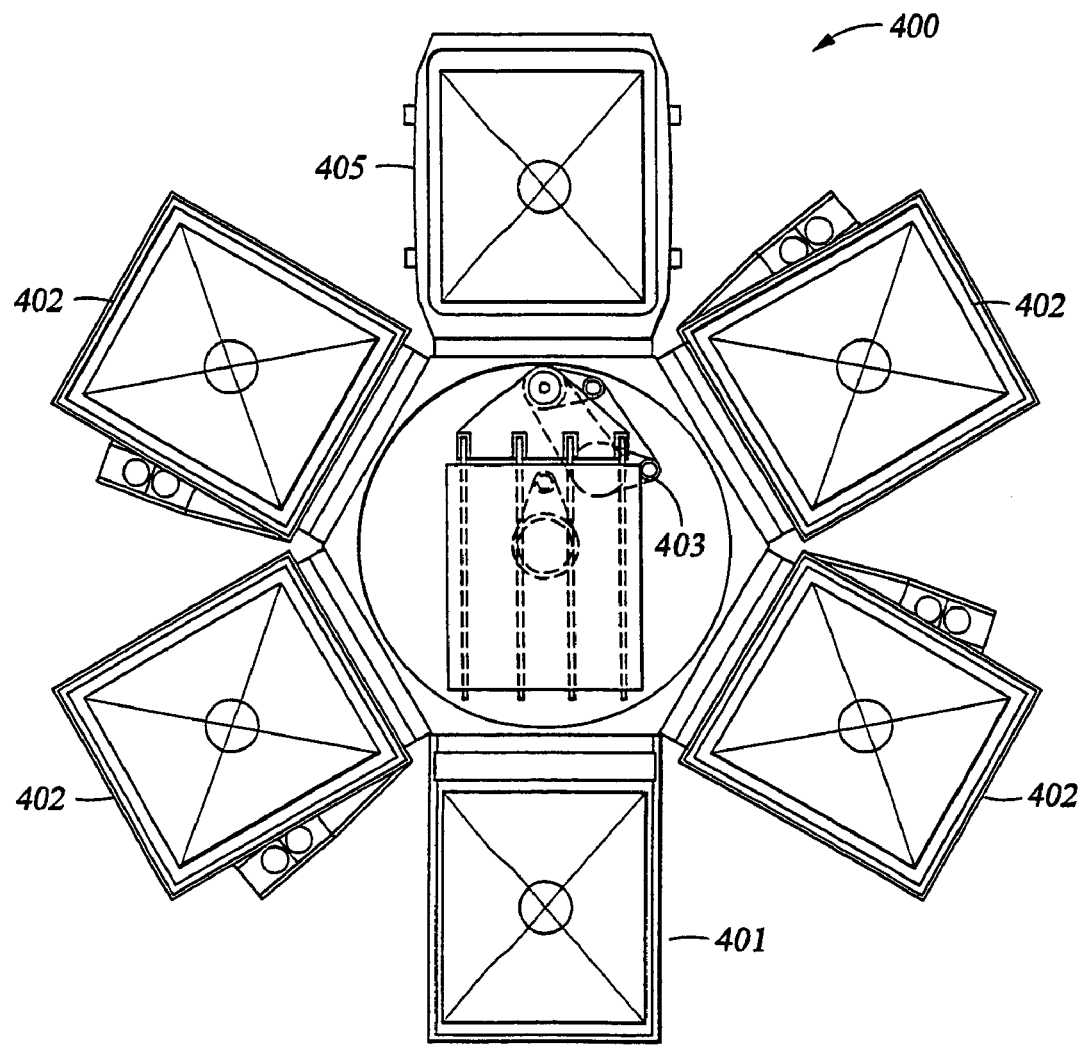
FIG. 4 is a schematic of a top view of a PECVD processing system 400 of the kind which can be used to deposit the films of the present invention. The PECVD processing system shown in FIG. 4 is an AKT™ 40 K PECVD System capable of processing substrates having dimensions of up to 1870 mm×2200 mm.

FIG. 4 shows a schematic of an AKT™ 40 K PECVD System, which is capable of processing substrates having dimensions of up to 1870 mm×2200 mm. However, similar systems are currently available up to a 60 K PECVD System which can handle substrates having dimensions up to 2200 mm×2600 mm. The AKT™ 40 K PECVD System 400 generally includes a loadlock chamber 401 for loading substrates (not shown) into the system; a robot assembly 403 for transferring substrates between chambers in the system; four PECVD processing chambers 402; and an optional bstrate heater 405. The AKT™ PECVD 40 K System is also available with a fifth PECVD processing chamber in place of substrate heater 405.

Figure 5A:
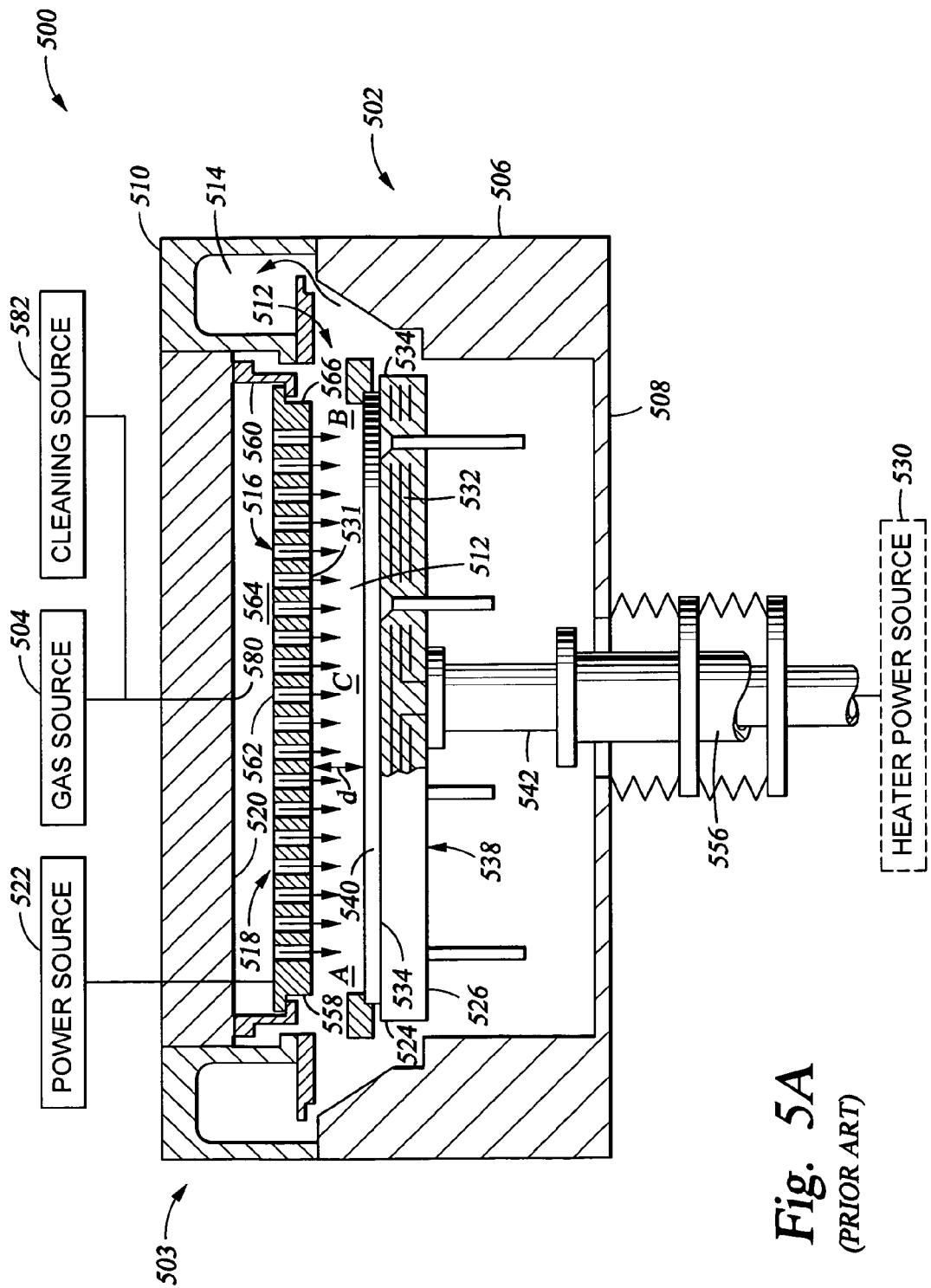
FIG. 5A is a schematic of a side view of a PECVD processing chamber 500 of the kind which can be used to deposit the films of the present invention.

FIG. 5A shows schematic side view of a PECVD processing chamber 500 of the kind which can be used to deposit the films of the present invention. The lower portion 502 of the processing chamber 500 is typically coupled to an upper portion 503 of the processing chamber, typically referred to as the lid assembly, which supplies film forming gaseous precursors, a power source for plasma generation and a source of cleaning reagents which are used for periodic cleaning of process chamber 500. The lower portion 502 of processing chamber 500 has walls 506 and a bottom 508 that partially define a processing volume 512 which includes areas A, B, and C. The processing volume 512 is typically accessed through a port (not shown) in the walls 506 that facilitate movement of a substrate 540 into and out of processing chamber 500. The walls 506 support the lid assembly 503 which includes assembly 510 that contains a pumping plenum 514 that couples the processing volume 512 to an exhaust port (that includes various pumping components, not shown).

A temperature controlled substrate support assembly 538 is disposed within the lower portion 502 of processing chamber 500. The substrate support assembly 538 including upper surface 534, side surface 524, and lower surface 526 upper surface 534 supports the glass (for example, but not by way of limitation) substrate 540 during processing. The substrate support assembly 538 typically encapsulates at least one embedded heater 532, such as a resistive element. The heater element 532 is coupled to a heater power source 530 which is controlled to heat the substrate support assembly 538 and the substrate 540 positioned thereon. Typically, in a CVD process, the heater maintains the substrate 540 at a uniform temperature between about 120° C. and 460° C., depending on the processing parameters required for the particular substrate.

Generally, the lower surface 526 of substrate support assembly 538 a lift 542 coupled thereto. The lift 542 couples the substrate support assembly 5 to a lift system (not shown) that moves the support assembly 538 between an elevated processing position (as shown) and a lowered position that facilitates substrate transfer to and from the processing chamber 500. The lift casing 556 provides a conduit (not shown) for electrical and thermocouple leads between the substrate support assembly 538 and other components of the PECVD system which work in combination with processing chamber 500.

The substrate support assembly 538 is generally grounded such that RF power supplied by a power source 522 to a gas distribution plate assembly 518 positioned between the lid assembly 503 and the substrate support assembly 538 (or other electrode positioned within or near the lid assembly of the chamber) may excite gases present in the processing volume 512 between the substrate support assembly 538 and the distribution plate assembly 518. The RF power from the power source 522 is generally selected commensurate with the size of the substrate, to drive the chemical vapor deposition process. The distance "d" illustrates the spacing between the upper surface 534 of substrate support assembly 538 and the lower surface 531 of distribution plate assembly 518. This is also the spacing between electrode surfaces, since distribution plate 518 acts as a first electrode, while substrate support 538 acts as the second electrode. The spacing "d", in combination with the thickness of the substrate 540, substantially determines the processing volume 512. The spacing "d" can be adjusted as necessary to provide the desired processing conditions.

The lid assembly 503 typically includes an entry port 580 through which process gases provided by the gas source 504 are introduced into processing chamber 500. The entry port 580 is also coupled to a cleaning source 582. The cleaning source 582 typically provides a cleaning agent, such as disassociated fluorine, that is introduced into the processing chamber 502 to remove deposition by-products and films from processing chamber hardware.

The gas distribution plate assembly 518 is coupled to an interior side 520 of the lid assembly 503. The gas distribution plate assembly 518 is typically configured to substantially follow the profile of the substrate 540, for example, polygonal for large area substrates and circular for wafers. The gas distribution plate assembly 518 includes a perforated area 516 through which process and other gases supplied from the gas source 504 are delivered to the processing volume 512. The perforated area 516 of the gas distribution plate assembly 518 is typically configured to provide uniform distribution of gases passing through the gas distribution plate assembly 518 into the processing chamber 500.

The gas distribution plate assembly 518 typically includes a diffuser plate 558 suspended from a hanger plate 560. The diffuser plate 558 and hanger plate 560 may alternatively comprise a single unitary member. A plurality of gas passages 562 are formed through the diffuser plate 558 to allow a predetermined distribution of a precursor source gas passing through the gas distribution plate assembly 518 and into the processing volume 512. The hanger plate 560 maintains the diffuser plate 558 and an interior surface 520 of the lid assembly 503 in a spaced-apart relation, thus defining a gas plenum 564 therebetween. The plenum 564 allows gases flowing through the lid assembly 503 to uniformly distribute across the width of the diffuser plate 558 so that gas is provided uniformly above the center perforated area 516 and flows with a uniform distribution through gas passages 562.

The diffuser plate 558 is typically fabricated from stainless steel, aluminum (Al), anodized aluminum, yttrium oxide-coated aluminum, nickel (Ni) or other RF conductive material. The diffuser plate 558 may be cast, brazed, forged, hot iso-statically pressed or sintered. Typically, the diffuser plate 558 is configured to have a thickness that maintains sufficient flatness at the edge of the aperture 566 in hanger plate 560 as not to adversely affect substrate processing. The average thickness of the diffuser plate 558 may range from about 0.8 inch to about 2.0 inches. The diffuser plate 558 may be circular for semiconductor wafer manufacturing or polygonal, such as rectangular, for flat panel display manufacturing. The shape of gas passages 562 may vary by location over the surface of diffuser plate 558. Further the lower surface 531 of gas diffuser plate 558 may be curved rather than flat in the interest of providing a more uniform film deposition.

The doped or un-doped (intrinsic) amorphous silicon (a-Si), silicon dioxide ($SiO_2$), silicon oxynitride (SiON) and silicon nitride (SiN) films of the kind which are used in the fabrication of liquid crystal displays, solar cells, and other devices which require the presence of an interface between film layers having different electrical properties can all be deposited using an embodiment of a plasma enhanced chemical vapor deposition (PECVD) system of the kind described above.

In the past, the basic principle behind the scale-up of PECVD processes was to maintain the intensive deposition parameters (such as process chamber pressure, electrode spacing, and substrate temperature) constant, while proportionately increasing the extensive deposition parameters (such as process gas flow rates and RF power to the plasma). However, due to ever increasing substrate sizes, which now exceed a surface area of 25,000 cm$^2$, problems have been observed which are not corrected by proportional increasing of the extensive deposition parameters, or even by a combination of proportional changes in both intensive and extensive deposition parameters.

Figure 5B:
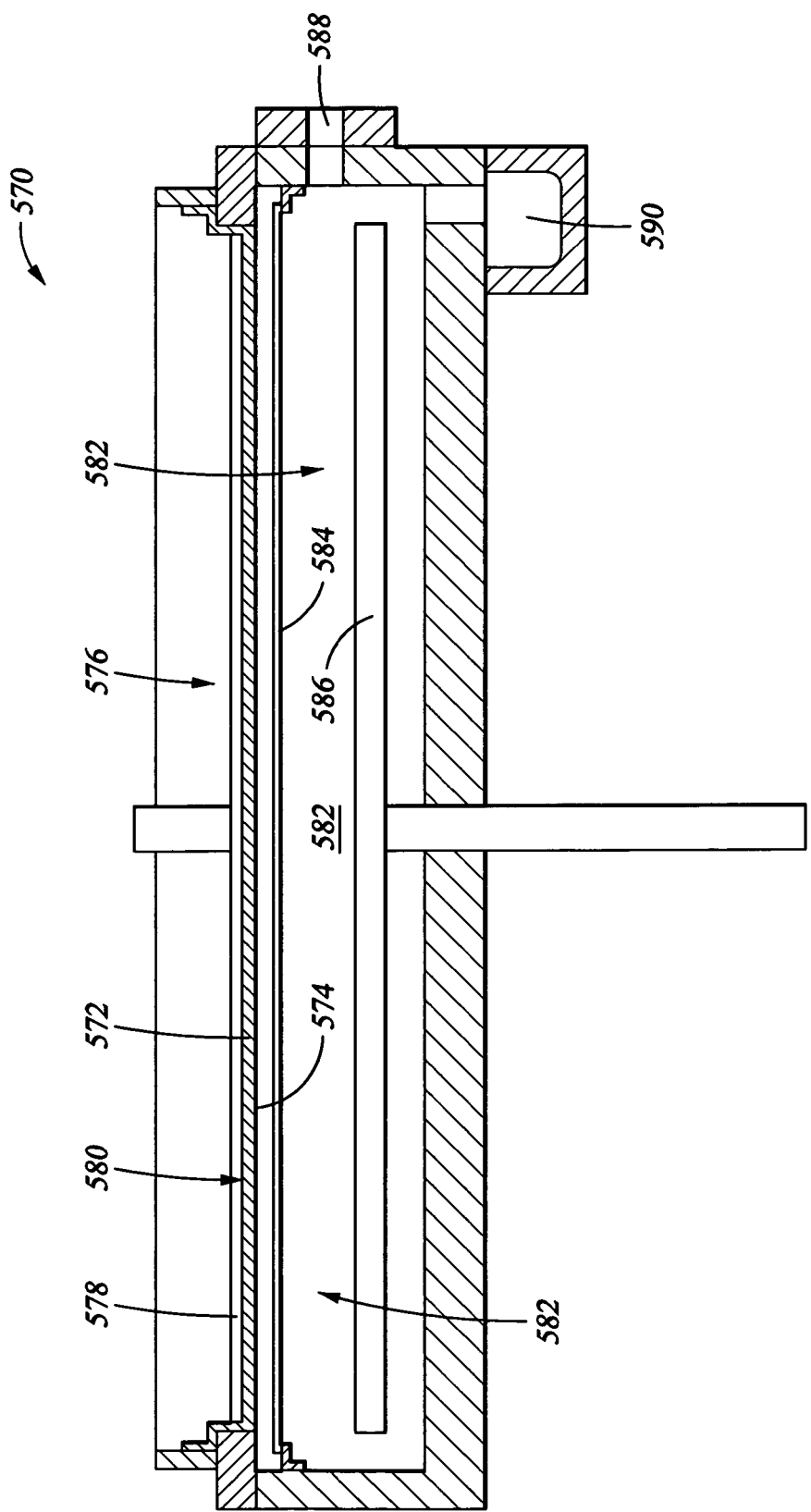
FIG. 5B is a schematic side view of a single PECVD processing chamber 570 of a another design embodiment than that shown in FIG. 5A.

FIG. 5B is a schematic side view of another, different design embodiment of a single PECVD processing chamber of the kind shown in FIG. 5A. Referring to FIG. 5B, a processing chamber 570 includes a diffuser plate 572 having a downstream, bottom surface 574 through which process gases enter processing chamber 570. An aluminum backing plate 576, to which RF power (not shown) is applied, is adjacent to diffuser plate 572. Diffuser plate 572 and backing plate 576 are separated by a space 578 which forms a plenum chamber 580 into which incoming gas flow is confined. Gas flow restriction by the diffuser plate 572 results in a significant difference in pressure between the plenum chamber 580 and the plasma processing region 582 of processing chamber 570, allowing a uniform gas flow distribution to be achieved. The processing chamber 570 also includes a shadow frame 584 which extends around the perimeter edge of the processing region 582, a substrate support (susceptor) 586, upon which the substrate (not shown) rests, and a gate valve 588, frequently referred to as a slit valve, through which substrates are transferred into and out of the processing chamber 570. A pumping port 590 which is in communication with processing region 582, facilitates the pumping spent processing gases out of the chamber. The pumps and other apparatus which are in communication with pumping port 590 are not shown.

As discussed above, the flat substrates upon which large TFT display devices are created frequently comprise a material that is essentially optically transparent in the visible spectrum. The substrate may be of varying shapes or dimensions. It was observed by the inventors that when the surface area exceeded about 25,000 cm$^2$, a haze was observed on the surface of the substrate after particular processing operations, such as ceasing deposition of first film and beginning deposition of a second film, where the composition of the films were different and where the first film was a silicon-containing film. A haze was also observed when arcing occurred and it was necessary to shut down to obtain a stable plasma and then to re-initiate film deposition of the same film composition, when that film contained silicon.

The haze was determined to indicate that not only was the light transmission of the film affected, but the electrical properties of the film were affected as well. A hazy film is a kind of powdery opaque film. Thus, this film reduces light transmission. Also, this film is typically produced at the end of deposition of a silicon-containing thin film layer, which forms an interface with the subsequently deposited, different thin film layer. The interface characteristics are important in determining device properties. Most of the electron transfer within the device occurs at the interface between layers.

Figure 6:
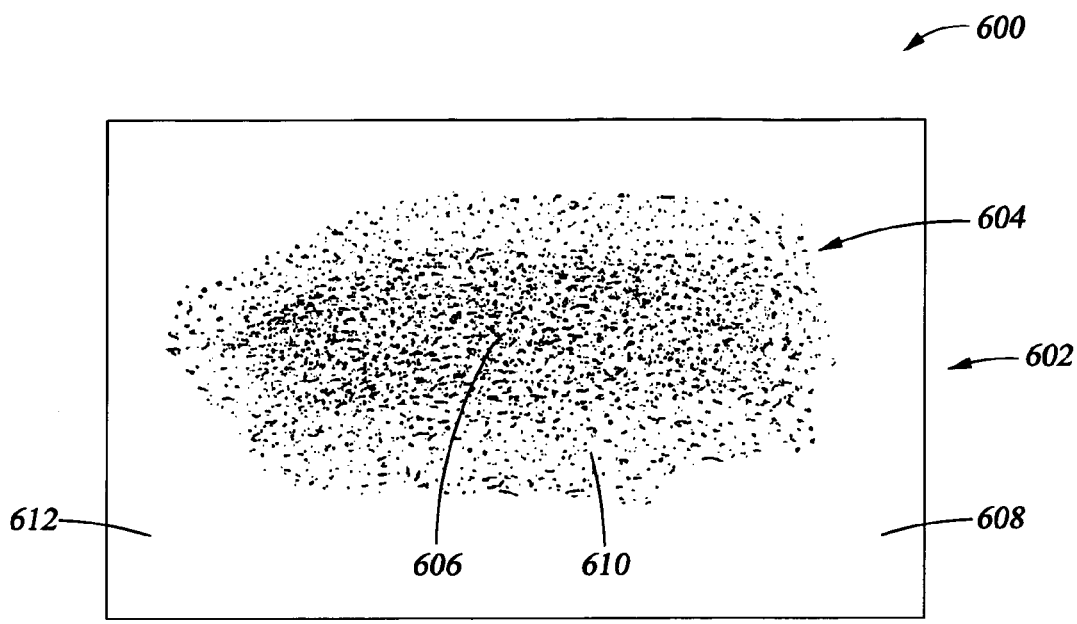
FIG. 6 is a schematic top view of a glass substrate upon which a silicon nitride film was formed, where a white haze appeared on the substrate surface over the area shown, and approximately at the illustrated density during the film deposition process.

FIG. 6 illustrates top surface 600 of a substrate 602 where a haze 604 was observed on the surface 608 of substrate 602.

The haze 604 was more concentrated in the central area 606, and thinned 610 toward the edge 612. However, on other occasions the top surface of a substrate has exhibited a haze which was not concentrated in the central area of the substrate, but was more random.

A similar haze formation occurred when deposition of a silicon-containing film was discontinued due to plasma arcing which required that the film deposition be discontinued.

Based on the test data collected, the inventors suspected that the problem was that the silicon-containing precursor compounds used to form the silicon-containing films were not completely reacting or were not reacting properly on the film-forming surface and were forming silicon-containing powdery material or haze (contaminant compounds) on the surface of the film which was being formed. This problem had not been observed for the smaller substrates processed, even though the same general processing conditions were used after adjustment for size scale up.

In a normal film deposition process of the kind which had been used on the smaller substrates, the RF power applied to form the plasma had been shut down at the same time the gas flows were discontinued, as part of the termination of film deposition. Investigation of processing variables in detail showed that the contaminant silicon compounds on the film surface could be prevented by maintaining the RF power in the process chamber for a time period after the silicon-containing precursor gas flow was turned off. Since there were other gases in addition to the silicon-containing precursor gas in the plasma source gas used for film formation, it was possible to maintain a plasma in the processing chamber after the silicon-containing precursor gas portion of the plasma source gas was shut off.

EXAMPLES

Example One

Figure 7:
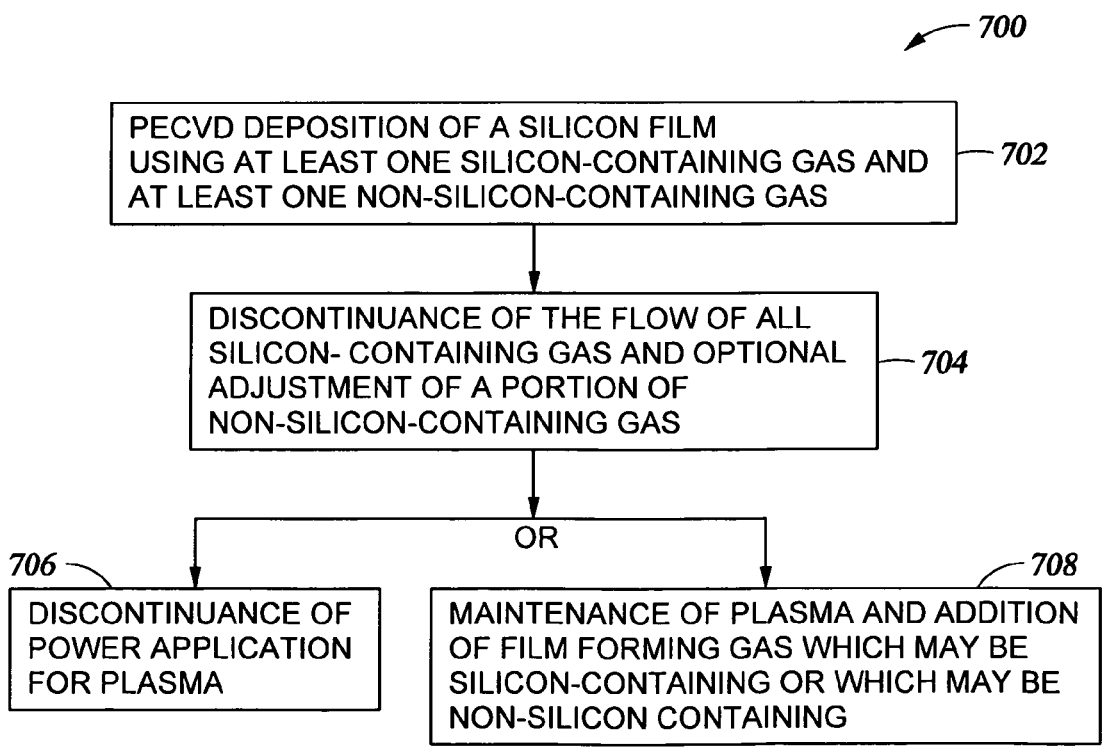
FIG. 7 shows a process step diagram which illustrates one embodiment of the invention which is used when it is desired to change the film which is being PECVD deposited from a silicon-containing film to a non-silicon containing film; or, simply to discontinue PECVD film deposition, when the final layer of film being deposited is a silicon-containing film.

FIG. 7 shows a process step diagram 700 which illustrates one embodiment of the invention, where a layer of a silicon-containing material is PECVD deposited using a combination of silicon-containing precursor gas and a non-reactive gas 702; where the flow of the silicon-containing precursor gas is discontinued, and a portion of the non-reactive gas may optionally be discontinued 704; and where the power applied to produce a plasma is either discontinued 706 or ramped down 708. This is an example of a series of steps which is frequently carried out when it is desired to change the film which is being PECVD deposited from a silicon-containing film to a non-silicon containing film; or simply to discontinue PECVD film deposition when the final layer of film being deposited is a silicon-containing film.

Example Two

Figure 8:
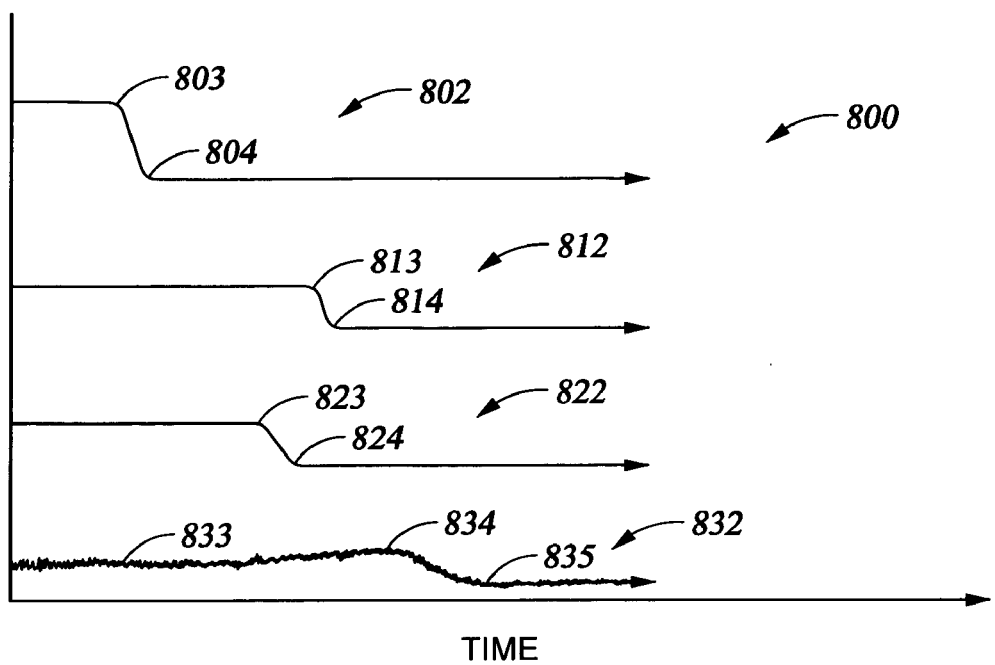
FIG. 8 is a comparative example graph 800 showing the RF power application, gas flows, and process chamber pressure, as a function of increasing time period during deposition of a silicon nitride film on a glass substrate. After completion of deposition of the film, and prior to initiating deposition of a second, different overlying film, the RF power was shut down prior to discontinuing gas flow of the silicon-containing precursor gas, as indicated. A haze was observed on the surface of the glass substrate after shut down of the film deposition process.

FIG. 8 shows a graph 800 for a set of test conditions used to determine whether the inventors concepts related to a method of preventing a haze during formation of a silicon-containing film were correct. FIG. 8 is provided for comparative purposes, as a contaminant haze was observed on the surface of the silicon nitride film formed under the process conditions illustrated. The FIG. 8 graph 800 illustrates the RF power application, gas flows, and process chamber pressure changes which occur as time progresses. The time shown on time line 801 is in seconds.

Curve 802 illustrates the amount of RF power applied to maintain the plasma in the processing chamber. At 803 on the curve, the RF power was 18 KW. The power was completely shut down at 804 on curve 802. Curve 812 shows the SiH$_4$ gas flow rate, where the gas flow rate was 5,000 sccm at 813 and decreased to 0 sccm at 814. Curve 822 shows the nitrogen gas flow rate, where the gas flow rate was 55,000 sccm at 823 and decreased to 0 sccm at 824. Curve 832 illustrates the pressure in the process chamber, where the pressure at 833 was about 1.5 Torr; fluctuated at 834, to less than about 0.1 Torr, due to gas shut off; and, then decreased to about 0 Torr at 835.

Figure 9:
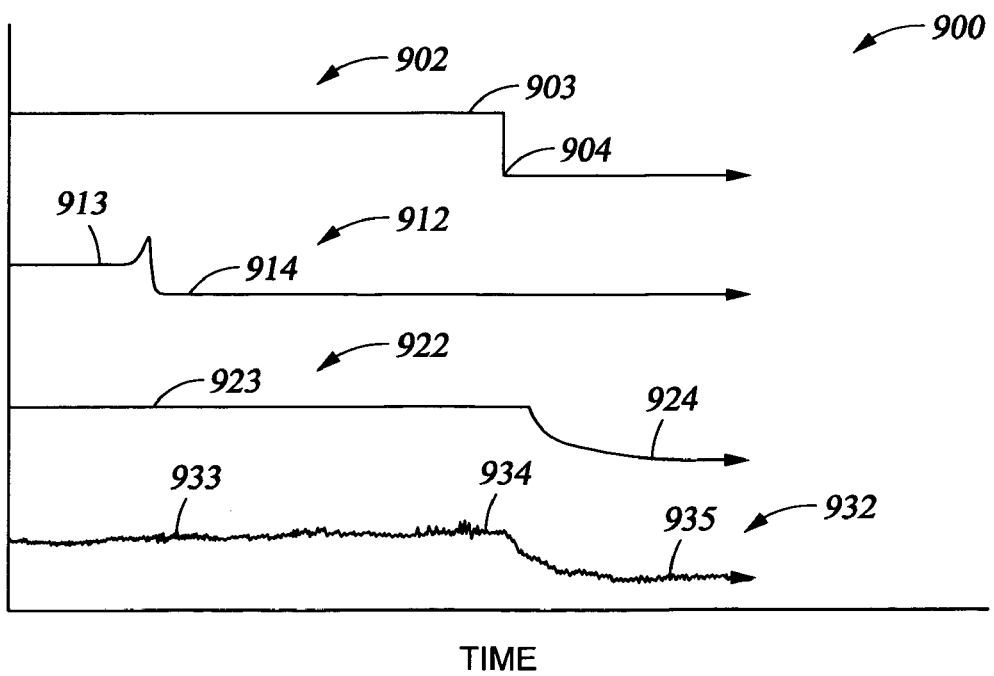
FIG. 9 is a graph 900 showing the RF power application, gas flows, and process chamber pressure with time during deposition of a silicon nitride film on a glass substrate. In this instance, after completion of deposition of the film, and prior to initiating deposition of a second, different overlying film, the RF power was shut down subsequent to discontinuing gas flow of the silicon-containing precursor gas, as indicated. No haze was observed on the surface of the glass substrate after complete shut down of the film deposition process.

FIG. 9 shows a graph 900 which illustrates a set of test conditions used to determine whether the inventors concepts related to a method of preventing a haze during formation of a silicon-containing film were correct. FIG. 9 is a graph showing the RF power application, gas flows, and process chamber pressure, as a function of increasing time, in seconds, during deposition of a silicon nitride film on a glass substrate, where there was no contaminant haze formed. The process variables for deposition of the silicon nitride film illustrated in FIG. 9 were the same as those with respect to FIG. 8, with the exception of the variables discussed below. Curve 902 illustrates the amount of RF power applied to maintain the plasma in the processing chamber. At 903 on the curve, the RF power was 18 KW. The power was completely shut down at 904 on curve 902. However, this occurred approximately 3 seconds after the SiH$_4$ gas flow was shut off. Curve 912 shows the SiH$_4$ gas flow rate, where the gas flow rate was 5,000 sccm at 913 and was completely shut off at 914. Curve 922 shows the nitrogen gas flow rate, where the gas flow rate was 55,000 sccm at 923 and was completely shut off at 924, about 3 seconds subsequent to shut down of the RF power. Curve 932 illustrates the pressure in the process chamber, where the pressure at 933 was about 1.5 Torr; fluctuated between about 1.5 Torr and less than about 0.1 Torr, at 934, due to gas shut off; and, then decreased to about 0 Torr at 935.

FIGS. 8 and 9 are representative of the processing characteristics when there is a shut down in the RF power, whether this is due to the end of the deposition of a silicon-containing film and the start of the deposition of an overlying film of a different composition; or, whether the RF power is shut down due to the end of the deposition of a final film layer, when that final film is a silicon-containing film. The formation of a contaminant haze can be avoided by maintaining RF power to the plasma source gas for a time period of at least about 1 second after shut-off of gas flow of any silicon-containing gas precursor contribution to the plasma source gas. The time requirements described in these Examples correspond with the design of the AKT 40K PECVD process chamber and the processing volume and gas flow rates which are characteristic when PECVD is carried out in that particular apparatus.

The real variable of concern here is the residence time of the silicon-containing gas in the process chamber after the RF power has been shut off. The 1 second time period is necessary to permit pumping out of the residual silicon-containing precursor portion of the plasma source gas prior to shut down of the RF power. One of skill in the art will be able to calculate the residence time of the residual silicon-containing precursor portion of the plasma source time, and will be able to shut down the RF power at a time which prevents the formation of silicon-containing powdery material or haze (contaminant compounds) on the film surface.

Example Three

Figure 10:
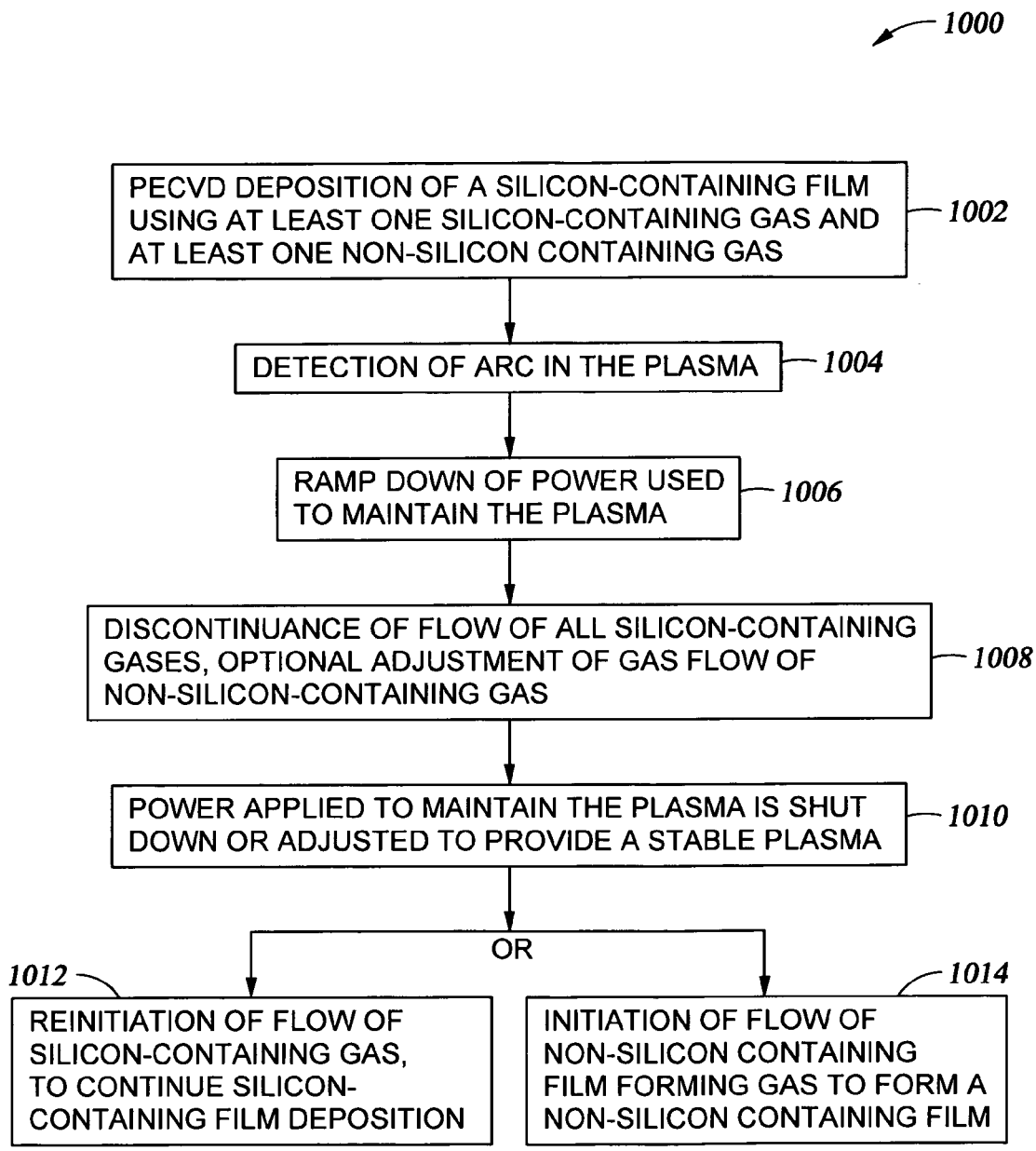
FIG. 10 shows a process step diagram for another embodiment of the present invention, where an arc in the plasma is detected during PECVD deposition of a thin film layer of a silicon-containing material. The flow of all silicon-containing gas is discontinued, while the flow of non-silicon containing gas continues; and, the power applied to produce the plasma is ramped down. The power applied to the plasma may be subsequently ramped up to create a stable plasma. If attempts to create a stable plasma fail, the plasma power may be shut down, and the plasma may be re-initiated subsequently. Once a stable plasma is accomplished, the silicon-containing gas flow is reinitiated, and deposition of the silicon-containing material reinitiated. Or, if the silicon-containing film deposition was near to completion at the time the plasma arc was detected, in the alternative, once the stable plasma is obtained, flow or a non-silicon containing film forming gas may be initiated to form a non-silicon-containing film.

FIG. 10 shows a process step diagram 1000 which illustrates one embodiment of the invention, where a layer of a silicon-containing material is PECVD deposited using a combination of silicon-containing gas, and at least one non-silicon-containing gas 1002; where an arc in the plasma is detected during film formation 1004, and the power applied to produce the plasma is ramped down, to reduce the potential for damage to the process chamber, but is maintained at a level which continues to support a plasma 1006. The flow of any silicon-containing gas is then discontinued, and a portion of the non-silicon-containing gases which make up the plasma may optionally be increased or decreased 1008. Within a time period typically ranging between about 0.5 and about 3.0 seconds after discontinuance of the silicon-containing gas, the power to the plasma is discontinued 1010. In the alternative, when an arc is detected, at the discretion of the operator of the equipment, an effort may be made to adjust the power to the plasma and regain a stable plasma prior to discontinuing the flow of silicon-containing gases. In any case, the power applied during adjustment must be at least the minimal amount to maintain a plasma. If power adjustment cannot produce a stable plasma, then the power may be ramped down; the silicon-containing gas discontinued; and the power applied to maintain the plasma may be shut down. Subsequently a plasma may be reinitiated 1012 and a flow of silicon-containing gas may be initiated 1014 to finish deposition of a silicon-containing film.

Example Four

Figure 11:
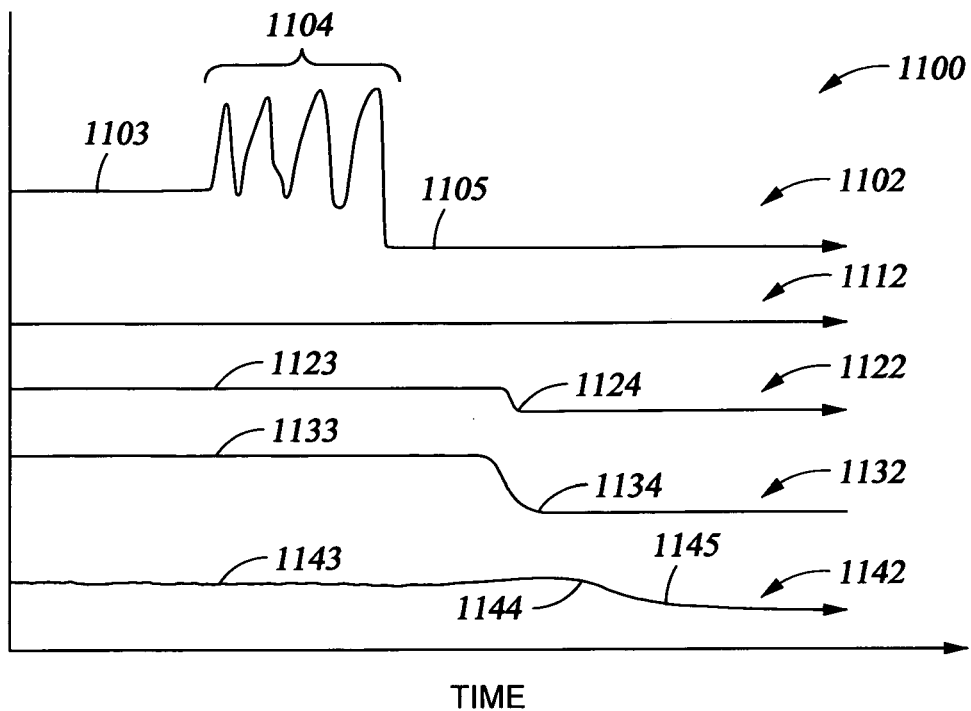
FIG. 11 is a comparative example graph 1100 showing the RF power application, gas flows, and process chamber pressure, as a function of increasing time during deposition of a silicon nitride film on a glass substrate. In this instance, there was a plasma arcing fault, and film deposition was discontinued, with an immediate shut down of the RF power. A haze was observed on the surface of the glass substrate after shut down of the film deposition process.

FIG. 11 shows a graph 1100 which illustrates a set of test conditions used to determine whether the inventors concepts related to a method of preventing a haze during formation of a silicon-containing film were correct. FIG. 11 is provided for comparative purposes, as a haze was observed on the surface of the silicon nitride film formed under the process conditions illustrated.

FIG. 11 shows a graph 1100 which illustrates the power application, gas flows, and process chamber pressure changes as time progresses in seconds. Curve 1102 illustrates the amount of RF power applied to maintain the plasma in the processing chamber. At 1103 on the curve, the RF power was 18 kW. At 1104, arcing occurred, and on the 1105 section of the curve, the power was completely shut down. Curve 1112 shows the hydrogen (H$_2$) gas flow, which was at 0 sccm for the complete time period illustrated. Curve 1122 shows the SiH$_4$ gas flow rate, where the gas flow rate was 6000 sccm over the 1123 section of the curve, and was decreased to 0 sccm over the 1124 section of the curve. Curve 1132 shows the nitrogen gas flow rate, where the gas flow rate was 50000 sccm over the 1133 section of the curve and decreased to 0 sccm over the 1134 section of the curve. Curve 1142 illustrates the pressure in the process chamber, where the pressure over the 1143 section of the curve was about 1.5 Torr, fluctuating to about 1.6 Torr, due to gas shut off at the 1144 section of the curve, and then increasing to about 0.1 Torr over the 1145 section of the curve.

Figure 12:
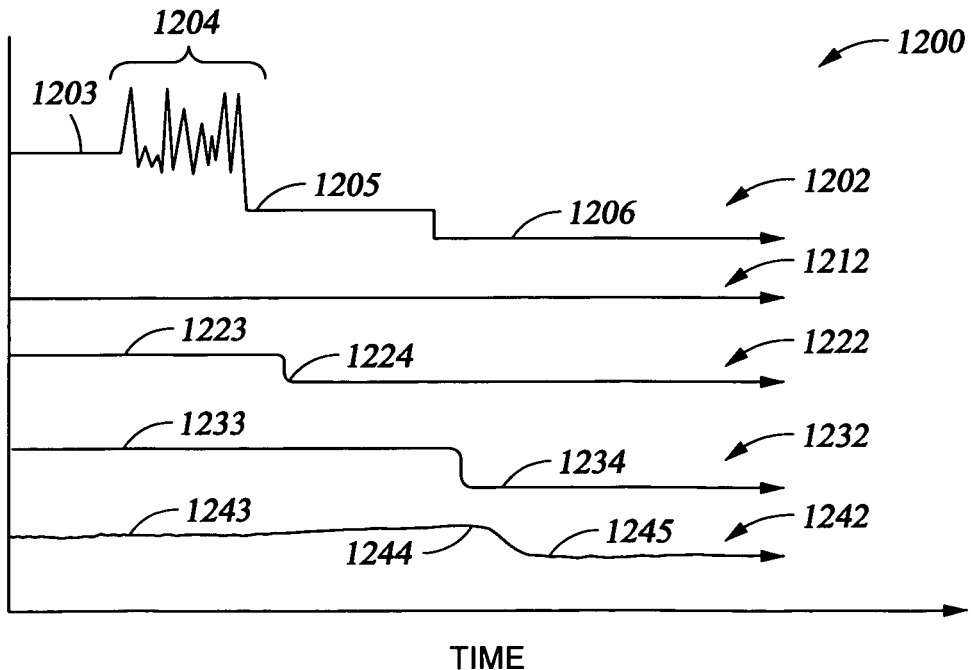
FIG. 12 is a graph 1200 showing the RF power application, gas flows, and process chamber pressure, as a function of increasing time, during deposition of a silicon nitride film on a glass substance. There was a plasma arcing fault, and film deposition was discontinued. However, the RF power was not shut down, but was reduced (ramped down) for a time period while the flow of all silicon-containing precursor gas was discontinued. After the time period of ramped down RF power, the RF power application was discontinued. No haze was observed on the surface of the glass substrate after shut down of the film deposition process.

FIG. 12 shows a graph 1200 which illustrates a set of test conditions used to determine whether the inventors concepts related to a method of preventing a haze during formation of a silicon-containing film were correct. FIG. 12 shows a graph 1200 illustrating a set of test conditions used to determine whether the inventors' concepts related to a method of preventing a haze during formation of a silicon-containing film were correct. FIG. 12 shows the power application, gas flows, and process chamber pressure with progressing time in seconds, during deposition of a silicon nitride film on a glass substrate, where there was no contaminant haze formed.

There was arcing as illustrated at 1204 during the film deposition, and the RF power was adjusted a number of times to stabilize the plasma, as illustrated at 1204, but a stable plasma was not achieved. As a result, the RF power to the plasma 1202 was ramped down, from 18 kW 1203 to 2 kW, as shown at 1205, but was maintained at a sufficient power level to maintain a plasma. Subsequently, the flow of silicon containing gas was shut down within about 0.75 second, as illustrated at 1224. The RF power was maintained at the 2 kW level until the silicon-containing precursor gas component of the plasma source gas had time to exit the plasma processing area. In this case, the RF power was maintained at the lower kW level until both the $SiH_4$ gas and the $N_2$ gas present in the plasma source gas had time to exit the plasma processing chamber, at which time the RF power was immediately shut down, as shown at 1206.

Curve 1212 shows the hydrogen ($H_2$) gas flow which was at 0 sccm for the time period illustrated. Curve 1222 shows the $SiH_4$ gas flow rate which was at 6000 sccm at section 1223 of the curve and was decreased to 0 sccm at 1224 of the curve. Curve 1232 shows the nitrogen ($N_2$) gas flow rate, where the gas flow rate was 50000 sccm over section 1233 of the curve and was decreased to 0 sccm at 1234 on the curve 1232. The pressure over section 1243 of curve 1242 was about 1.5 Torr, fluctuation to about 1.6 torr over section 1244 of the curve 1242, and then decreased to about 0.1 Torr over section 1245 of the curve 1242.

An alternative to the procedure shown in FIG. 12 would be to discontinue the flow of silicon-containing gases at the time an arc in the plasma occurs, to adjust the RF power to the plasma in an attempt to obtain a stable plasma, and then to reinitiate the flow of silicon-containing gases if a stable plasma is obtained.

As discussed above, in the case where arcing occurs, the RF power may be reduced, but not shut down, to prevent the deposition of partially reacted silicon compound (or compounds) which contaminate a PECVD-deposited silicon-containing film. The reduced amount of RF power which needs to be applied to prevent the formation of the silicon-containing contaminant on the film surface will depend on the particular film deposition apparatus, but one skilled in the art, after reading the disclosure herein will be able to estimate the amount of RF power which should be used, and with minimal experimentation will be able to optimize the RF power used.

While the invention has been described in detail above with reference to particular embodiments, various modifications within the scope and spirit of the invention will be apparent to those of working skill in this technological field. Accordingly, the scope of the invention should be measured by the appended claims.

We claim:

1. A method of avoiding the formation of a powdery material on a surface of a silicon-containing PECVD-deposited film during completion of the silicon-containing film deposition, said method comprising:
   a) discontinuance of a flow of all silicon-containing gas in a plasma source gas, optionally with accompanying adjustment of a flow of a portion of said plasma source gas which is non-silicon-containing and non-reactive with said silicon-containing film, so that a composition of deposited silicon-containing film is not affected;
   b) maintaining a plasma in said non-silicon-containing, non-reactive plasma source gas for a minimum time period of about 0.5 seconds after discontinuance of said flow of all silicon-containing gas in said plasma source gas; and
   c) subsequently shutting down power to said plasma, whereby said plasma is shut down.

2. A method in accordance with claim 1, wherein subsequent to step b) and prior to step c) a step b-2) is carried out in which a film-forming gas is added to said step b) non-silicon containing plasma source gas for a time period sufficient to form a film over a surface of said silicon-containing PECVD-deposited film.

3. A method in accordance with claim 2, wherein said film formed over a surface of said silicon-containing PECVD film is a transparent conductor film.

4. A method of avoiding the formation of a powdery material on the surface of a silicon-containing PECVD-deposited film when an arc is detected in a plasma during deposition of said film, said method comprising:
   a) detecting arcing in said plasma;
   b) ramping down of power to said plasma, while maintaining a plasma;
   c) adjusting of said power to said plasma until said plasma is stabilized;
   d) continuing deposition of said PECVD-deposited film. including flow of said silicon-containing gas to said plasma;
   e) discontinuing flow of a silicon-containing gas to said plasma; and
   f) subsequent to step e) discontinuing power to said plasma after passage of a minimal time period ranging from about 0.5 second to about 3 seconds.

5. A method in accordance with claim 1, wherein said time period during which a plasma is maintained after discontinuance of said flow of all silicon-containing gas ranges from about 0.5 seconds to about 3 seconds.

* * * * *